(12) United States Patent
Hartnett et al.

(10) Patent No.: US 8,621,304 B2
(45) Date of Patent: Dec. 31, 2013

(54) BUILT-IN SELF-TEST SYSTEM AND METHOD FOR AN INTEGRATED CIRCUIT

(75) Inventors: Fred Hartnett, Plano, TX (US); Robert McFarland, Murphy, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 2097 days.

(21) Appl. No.: 10/960,590

(22) Filed: Oct. 7, 2004

(65) Prior Publication Data
US 2006/0080584 A1   Apr. 13, 2006

(51) Int. Cl.
*G01R 31/28* (2006.01)
(52) U.S. Cl.
USPC ............................................................ 714/733
(58) Field of Classification Search
USPC ................................................ 714/726, 733
See application file for complete search history.

(56) References Cited

U.S. PATENT DOCUMENTS

| | | | |
|---|---|---|---|
| 5,173,906 A | 12/1992 | Dreibelbis et al. | |
| 5,301,156 A * | 4/1994 | Talley | 365/201 |
| 5,416,784 A | 5/1995 | Johnson | |
| 5,450,455 A * | 9/1995 | Hamilton et al. | 375/213 |
| 5,553,082 A * | 9/1996 | Connor et al. | 714/733 |
| 5,568,437 A | 10/1996 | Jamal | |
| 5,600,658 A | 2/1997 | Qureshi | |
| 5,719,879 A * | 2/1998 | Gillis et al. | 714/726 |
| 5,761,215 A | 6/1998 | McCarthy et al. | |
| 5,946,246 A | 8/1999 | Jun et al. | |
| 5,961,653 A | 10/1999 | Kalter et al. | |
| 5,996,097 A | 11/1999 | Evans et al. | |
| 6,000,048 A | 12/1999 | Krishna et al. | |
| 6,085,346 A | 7/2000 | Lepejian et al. | |
| 6,088,823 A | 7/2000 | Ayres et al. | |
| 6,182,257 B1 | 1/2001 | Gillingham | |
| 6,249,893 B1 * | 6/2001 | Rajsuman et al. | 714/741 |
| 6,263,461 B1 | 7/2001 | Ayres et al. | |
| 6,272,653 B1 | 8/2001 | Amstutz | |
| 6,343,366 B1 | 1/2002 | Okitaka | |
| 6,349,398 B1 | 2/2002 | Resnick | |
| 6,367,042 B1 | 4/2002 | Phan et al. | |
| 6,370,664 B1 | 4/2002 | Bhaw mik | |
| 6,374,370 B1 | 4/2002 | Bockhaus et al. | |
| 6,393,594 B1 | 5/2002 | Anderson et al. | |
| 6,415,403 B1 | 7/2002 | Huang et al. | |
| 6,427,217 B1 | 7/2002 | Hartnett | |
| 6,438,722 B1 | 8/2002 | Bailey et al. | |
| 6,463,560 B1 | 10/2002 | Bhaw mik et al. | |
| 6,505,317 B1 | 1/2003 | Smith et al. | |
| 6,510,530 B1 | 1/2003 | Wu et al. | |
| 6,510,534 B1 * | 1/2003 | Nadeau-Dostie et al. | 714/724 |
| 6,536,008 B1 | 3/2003 | Nadeau-Dostie et al. | |
| 6,560,740 B1 | 5/2003 | Zuraski, Jr. et al. | |
| 6,564,347 B1 | 5/2003 | Mates | |
| 6,564,348 B1 | 5/2003 | Barenys et al. | |
| 6,564,349 B1 | 5/2003 | Mitten et al. | |
| 6,574,757 B1 | 6/2003 | Park et al. | |
| 6,574,760 B1 | 6/2003 | Mydill | |
| 6,574,762 B1 | 6/2003 | Karimi et al. | |
| 6,665,817 B1 * | 12/2003 | Rieken | 714/30 |
| 6,668,347 B1 * | 12/2003 | Babella et al. | 714/733 |
| 6,882,583 B2 * | 4/2005 | Gorman et al. | 365/200 |

(Continued)

*Primary Examiner* — James C Kerveros

(57) ABSTRACT

An integrated circuit comprises random logic communicatively coupled to a non-scannable memory array. The integrated circuit also comprises a built-in self-test (BIST) controller adapted to apply test data to the random logic and propagate the test data through the random logic to test the memory array.

20 Claims, 2 Drawing Sheets

(56) References Cited

U.S. PATENT DOCUMENTS

| | | | |
|---|---|---|---|
| 7,346,823 B1* | 3/2008 | Maheshwari et al. | 714/733 |
| 2002/0091979 A1 | 7/2002 | Cooke et al. | |
| 2002/0174382 A1 | 11/2002 | Ledford et al. | |
| 2002/0194545 A1 | 12/2002 | Abbott | |
| 2002/0194557 A1 | 12/2002 | Park | |
| 2002/0194558 A1 | 12/2002 | Wang et al. | |
| 2003/0023914 A1 | 1/2003 | Taylor et al. | |
| 2003/0070118 A1 | 4/2003 | Nakao et al. | |
| 2003/0074618 A1 | 4/2003 | Dorsey | |
| 2003/0101376 A1 | 5/2003 | Sanghani | |
| 2003/0106004 A1 | 6/2003 | Ricchetti et al. | |

* cited by examiner

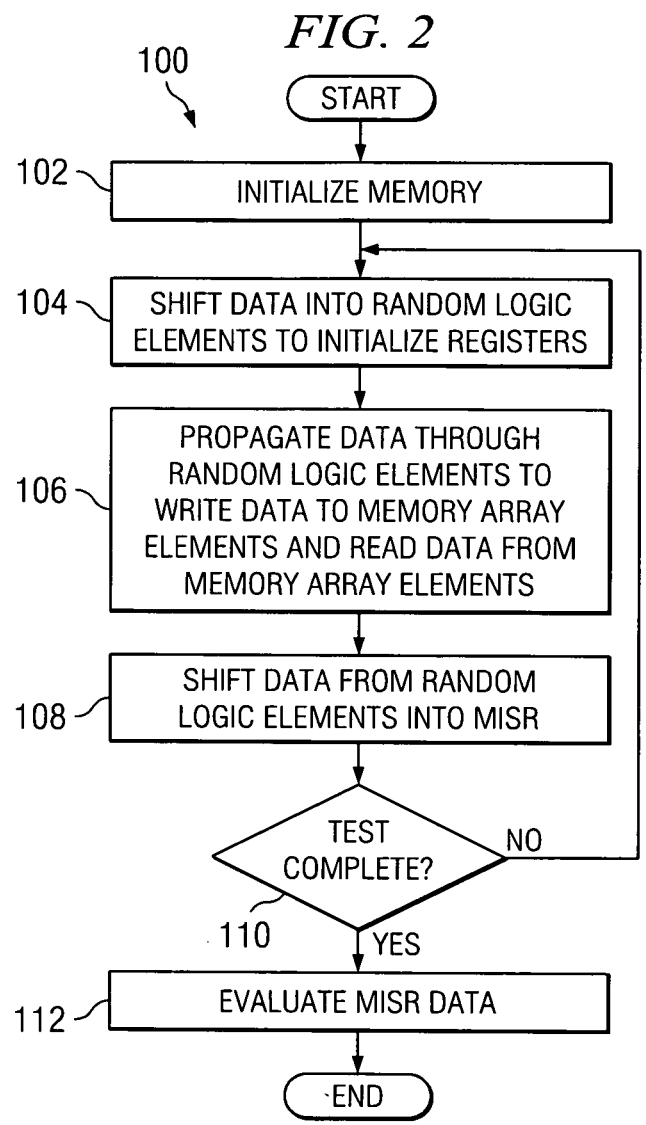

BUILT-IN SELF-TEST SYSTEM AND METHOD FOR AN INTEGRATED CIRCUIT

BACKGROUND OF THE INVENTION

Many integrated circuits (ICs) comprise a self-test circuit known as a Built-In Self-Test (BIST) circuit to test the integrated circuit. Logic BIST is used to electrically test the logic gates within the integrated circuit. For example, a BIST circuit generally includes a pattern generator for producing test patterns such that patterns are applied to the IC under test and the response thereto analyzed by means of a signature register output.

However, when embedded memories are present in the IC, one or more memory BIST controllers are generally required to test the embedded memory. Thus, the presence of memory BIST controllers generally results in substantial die area being consumed by the memory BIST controllers. Additionally, memory BIST controllers can introduce unacceptable timing delays in the input path of the embedded memory and generally require additional cost to develop and implement.

SUMMARY OF THE INVENTION

In accordance with an embodiment of the present invention, an integrated circuit comprises random logic communicatively coupled to a non-scannable memory array. The integrated circuit also comprises a built-in self-test (BIST) controller adapted to apply test data to the random logic and propagate the test data through the random logic to test the memory array.

In accordance with another embodiment of the present invention, a test method for an integrated circuit comprises loading test data into random logic of the integrated circuit. The method also comprises propagating the test data through the random logic to test a non-scannable memory array of the integrated circuit.

BRIEF DESCRIPTION OF THE DRAWINGS

For a more complete understanding of the present invention, the objects and advantages thereof, reference is now made to the following descriptions taken in connection with the accompanying drawings in which:

FIG. 2 is a flow diagram illustrating an embodiment of a method for built-in self-testing of an integrated circuit in accordance with the present invention.

DETAILED DESCRIPTION OF THE DRAWINGS

Figure 1:
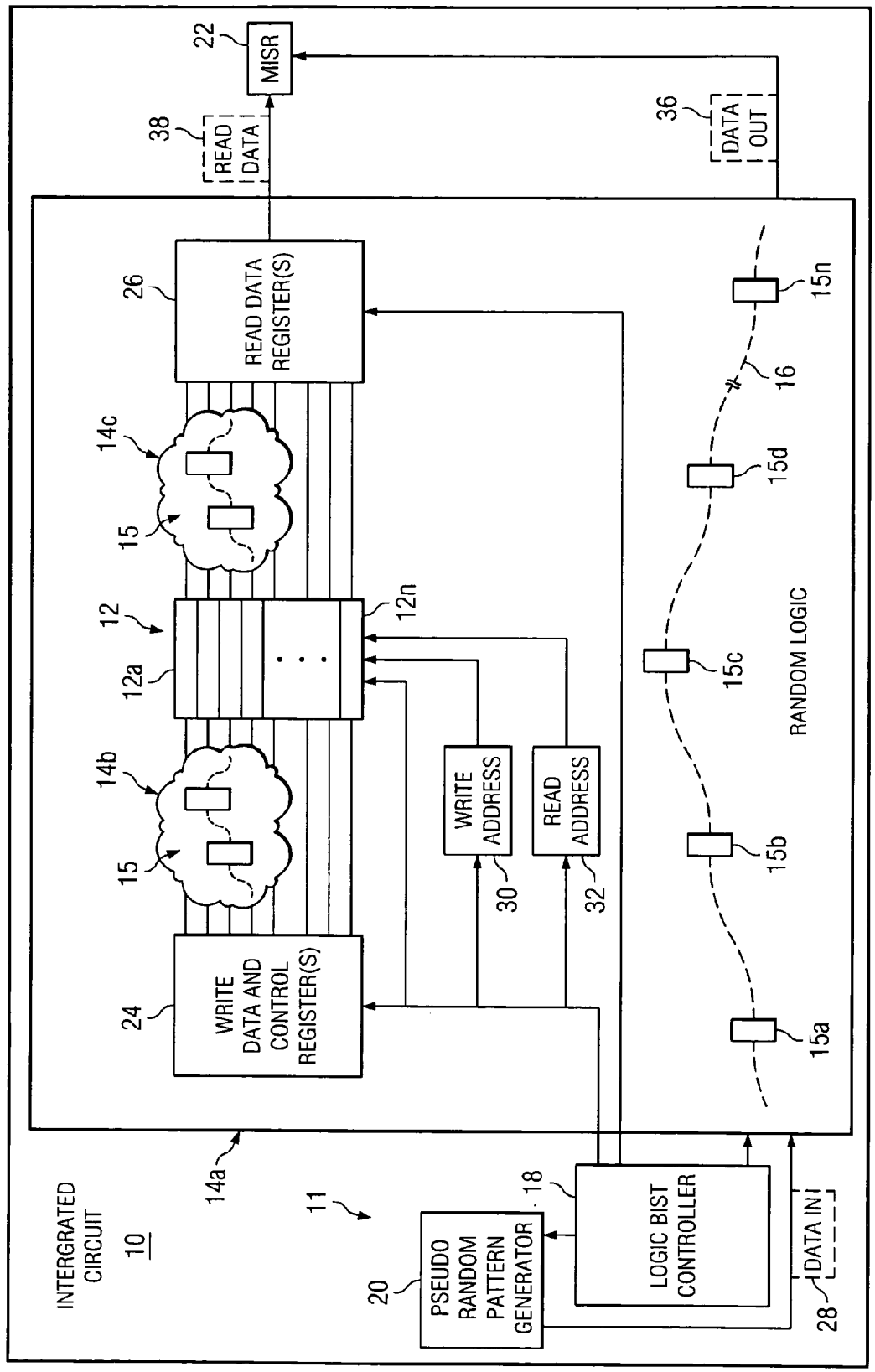
FIG. 1 is a diagram illustrating a schematic view of an embodiment of an integrated circuit incorporating a built-in self-test system in accordance with the present invention.

The preferred embodiment of the present invention and its advantages are best understood by referring to FIGS. 1 and 2 of the drawings, like numerals being used for like and corresponding parts of the various drawings.

FIG. 1 is a diagram illustrating a schematic view of an embodiment of an integrated circuit (IC) 10 incorporating a built-in self-test system 11 in accordance with the present invention. IC 10 comprises an embedded non-scannable memory array 12 and random logic 14a, 14b and 14c. As illustrated in FIG. 1, random logic 14 and embedded memory 12 may be implemented within IC 10 at a variety of different locations or regions (e.g., random logic 14 may be disposed anywhere in and/or around embedded memory 12). Each area or region of random logic 14 comprises scan registers 15 (for ease of description and illustration, scan registers 15 are illustrated in FIG. 1 only with respect to random logic 14a; however, it should be understood that scan registers 15 also reside in random logic 14b and 14c of FIG. 1 and elsewhere within IC 10 (e.g., read and/or write data and control registers and write/read address registers)). Additionally, it should be understood that random logic 14 may reside elsewhere within IC 10 other than where illustrated in FIG. 1. Preferably, scan registers 15 reside along and/or are otherwise daisy-chained together to form a scan ring 16. Additionally, it should be understood that random logic 14 comprises other types of functional elements such as logic gates (e.g., latches, AND gates, NAND gates, OR gates, NOR gates and XOR gates).

In the embodiment illustrated in FIG. 1, embedded memory 12 comprises an array of data storage registers, nodes, locations or elements 12a-12n, where n comprises an integer representing the quantity of storage elements of memory 12. In the embodiment illustrated in FIG. 1, IC 10 also comprises a logic BIST controller 18 communicatively coupled with embedded memory 12 and at least a portion of random logic 14. In the embodiment illustrated in FIG. 1, IC 10 also comprises a pseudo-random pattern generator (PRPG) 20 communicatively coupled to at least a portion of random logic 14 and logic BIST controller 18.

In the embodiment illustrated in FIG. 1, embedded memory 12 is communicatively coupled between write data and control register(s) 24 and read data register(s) 26. In operation, write data and control register(s) 24 and read data register(s) 26 control write and read data operations, respectively, associated with embedded memory 12. In the embodiment illustrated in FIG. 1, embedded memory 12 and logic under test 14 are communicatively coupled to a Multiple-Input Signature Register (MISR) 22.

In operation, embedded memory 12 is initialized such that data is written to each storage element 12a-12n of embedded memory. The initialization of embedded memory 12 may be performed using a variety of different methods or techniques. For example, in some embodiments of the present invention, a scan operation is used to initialize storage elements of memory 12 such that a particular random logic 14 scan chain 16 is selected, load instructions are provided to the selected chain 16, and test-mode select (TMS) sequences and/or clock cycles load data into the selected chain 16. Periodically, with each clock cycle and/or as otherwise dictated by the load instruction, known data in the selected chain 16 is written to an element 12a-12n in memory 12 corresponding to address and data information contained in the scan chain 16. In some embodiments of the present invention, an address counter is incremented as data write operations occur to particular elements 12a-12n to ensure that known data is written to each element 12a-12n. Thus, in operation, using a scan operation as described above, data is scanned into the chain 16 and, depending on the loaded instruction, subsequent clock cycle(s) cause a data write operation into memory 12. During subsequent loads and corresponding clock cycles, different addresses of embedded memory 12 corresponding to elements 12a-12n are indicated such that data is written to all elements 12a-12n of memory 12. However, it should be understood that other methods or techniques may be used to initialize embedded memory 12 (e.g., when scan/initialize a particular scan chain 16 with an initial load operation, the load instruction may be configured to reset all elements 12a-12n of embedded memory 12).

After memory 12 initialization, BIST controller 18 communicates with and/or otherwise utilizes PRPG 20 to shift test data into random logic 14 chain(s) 16 to exercise embedded memory 12. For example, in operation, BIST controller 18 causes PRPG 20 to load scan chain(s) 16 by applying or otherwise loading data, illustrated as "data in" 28 in FIG. 1, to scannable elements 15a-15n of the random logic 14 scan chain(s) 16. Subsequent clock cycles of BIST controller 18 cause the data to propagate through the various levels and/or elements 15a-15n of the random logic 14 scan chain 16. Data load instructions comprise write address information, illustrated as "write address" 30 in FIG. 1, and/or read address information (indicating which data of memory 12 is multiplexed into a read element 12a-12n of memory 12), illustrated as "read address" 32 in FIG. 1, causing data read and write operations to be performed relative to particular elements 12a-12n of memory 12. Thus, in operation, the process or operation is repeated via additional or subsequent clock cycles at least until read and write operations have been performed on all elements 12a-12n of memory 12 and all random logic 14 elements 15a-15n have been exercised. Data is unloaded from the random logic 14 scan chain 16, indicated by "data out" 36 in FIG. 1, to MISR 22 and data read out of embedded memory 12 to MISR 22, indicated as "read data" 38 in FIG. 1, are compared against expected values. Therefore, because reads and writes are performed to embedded memory 12 by random logic 14 during BIST controller 18 operation, data within MISR 22 is used to detect and/or otherwise identify any defects within embedded memory 12.

In some embodiments of the present invention, to ensure that outputs of memory elements 12a-12n are deterministic, reads to invalid memory elements 12a-12n are disallowed. For example, because of the random nature of particular logic BIST tests, the BIST test may result in or otherwise cause a read of an invalid memory element 12a-12n, such as where the depth of the memory 12 is not a power of two (e.g., 2, 4, 8, 16, etc.). In this particular application, in accordance with some embodiments of the present invention, address aliasing is used such that any reads of an unsupported memory element 12a-12n results in the contents of a valid memory element 12a-12n being output from memory 12. In other embodiments of the present invention, a fixed or predetermined value is output when a particular memory element 12a-12n is invalid. However, it should be understood that other methods of techniques may also be used to ensure deterministic results.

In operation, if the read address and write address for a particular memory element is the same for a particular BIST clock cycle, a race condition through the embedded memory may result, thereby causing or resulting in a marginal or slow timing path and, potentially, an indeterminate memory value read from the embedded memory. Thus, in some embodiments of the present invention, to prevent or otherwise overcome such a condition, memory 12 is configured, or a write condition is otherwise controlled, to prevent a write operation to memory 12 from occurring if the read address and write address are identical (including any aliased addresses). In other embodiments of the present invention, to prevent or otherwise overcome such a condition, bypass logic is employed such that the data presented to a particular memory element 12a-12n for a write operation is also presented at the output of the memory 12 instead of the contents of the particular memory element 12a-12n. In yet other embodiments of the present invention, to prevent or otherwise overcome such a condition, an output of a fixed or predetermined value is performed in response to a write operation or, alternatively, one or more read or write address signals may be inverted when the two addresses match. Thus, a variety of types of methods or techniques may be used to prevent or otherwise overcome such a condition.

Additionally, during BIST testing, two or more write ports may exist on an embedded memory. In some embodiments of the present invention, to compensate for such a condition, memory 12 is configured such that each write port is prioritized relative to other write ports. In other embodiments of the present invention, to compensate for such a condition, one or more write address signals are forced to be the complement of another write port address signal during the logic BIST testing mode. Thus, it should be understood that a variety of types of methods or techniques may be implemented to compensate for such a condition.

FIG. 2 is a flow diagram illustrating an embodiment of a method 100 for built-in self-testing of an integrated circuit in accordance with the present invention. The method begins at block 102, where embedded memory 12 is initialized. As described above, in some embodiments of the present invention, load instructions are provided to random logic 14 scan chain 16 and corresponding test-mode select (TMS) sequences and/or clock cycles are used to load and/or otherwise propagate data through the scan chain 16 and also write data to elements 12a-12n in memory 12 corresponding to address and data information contained in the load instruction.

At block 104, random logic 14 registers 15a-15n are initialized by loading data generated by PRPG 20 into the random logic 14 scan chain 16. At block 106, clock cycles of BIST controller 18 cause the data to propagate through elements 15a-15n of random logic 14, thereby causing test data to be written to and read from memory elements 12a-12n. At block 108, data is shifted and/or otherwise read out of random logic 14 elements 15a-15n (e.g., resulting from additional clock cycles of BIST controller 18 as necessary) to MISR 22. At decisional block 110, a determination is made whether BIST testing is complete. If BIST testing is not yet complete, the method proceeds to block 104 where additional data is loaded into the scan chain 16 and additional clock cycles are used to obtain additional propagation of data through scan chain 16. If BIST testing is complete, the method proceeds to block 112, where a comparison of BIST output values (e.g., data 36 and 38) are evaluated or otherwise compared to expected or desired results.

Thus, embodiments of the present invention enable BIST testing of an integrated circuit using a single logic BIST controller 18, thereby reducing the area on the integrated circuit that would otherwise be occupied by memory BIST controllers and reducing the cost associated with the design and formation of the integrated circuit. If desired, the different functions described herein may be performed in any order and/or concurrently with each other. Furthermore, if desired, one or more of the above-described functions may be optional or may be combined without departing from the scope of the present invention.

What is claimed is:
1. An integrated circuit, comprising:
random logic communicatively coupled to a non-scannable memory array; and
a logic built-in self-test (BIST) controller that applies test data to the random logic, the logic BIST controller to:
propagate test data through the random logic during subsequent clock cycles, the propagation of test data including read operations to a storage element of the non-scannable memory array, wherein in response to a read to an invalid storage element, an address of a valid storage element is aliased or a predetermined fixed value is provided to output as valid data, and output of the test data from the random logic, wherein the outputted test data includes the valid data if the read to the invalid storage element is performed, and the outputted test data is compared to an expected result to test the non-scannable memory array.

2. The integrated circuit of claim 1, wherein the non-scalable memory array is initialized before testing the non-scalable memory array via the propagated test data.

3. The integrated circuit of claim 1, wherein the random logic is used to initialize the non-scalable memory array.

4. The integrated circuit of claims 1, wherein the logic BIST controller causes output of the test data from the random logic to a multiple-input signature register (MISR).

5. The integrated circuit of claim 1, wherein responsive to a read address and a write address being the same for a particular clock cycle, the logic BIST controller is to provide data presented for the write address as output from the same address, provide a fixed value as output from the same address, or invert read or write address signals.

6. The integrated circuit of claim 1, wherein responsive to an existence of two or more write ports in the non-scannable memory array during the propagation of test data, the logic BIST controller prioritizes each write port relative to other write ports.

7. An integrated circuit, comprising:
means for communicatively coupling a non-scannable memory array to a random logic; and
means for applying test data to the random logic and propagating the test data through the random logic during subsequent clock cycles, the propagation of test data including read and write operations to a storage element of the non-scannable memory array, wherein in response to a read to an invalid storage element, an address of a valid storage element is aliased or a predetermined fixed value is provided to output as valid data,
the means for applying and propagating the test data further outputting the test data from the random logic, wherein the outputted test data includes the valid data if the read to the invalid storage element is performed, and the outputted test data is compared to an expected value to test the means for communicatively coupling the non-scannable memory array to the random logic.

8. The integrated circuit of claim 7, further comprising means for initializing the non-scalable memory array.

9. The integrated circuit of claim 7, comprising means for providing data presented for the write address as output from the same address, providing a fixed value as output from the same address, or inverting read or write address signals responsive to a read address and write address being the same for a particular clock cycle, providing.

10. The integrated circuit of claim 7, comprising means for prioritizing each write port relative to other write ports responsive to an existence of two or more write ports in the non-scannable memory array during the propagation of test data, providing.

11. A test method for an integrated circuit, comprising:
loading test data into random logic of the integrated circuit;
propagating, with a logic built-in test (BIST) controller, the test data through the random logic during subsequent clock cycles, the propagation of test data including read and write operations to a storage element of the non-scannable memory array, wherein in response to a read to an invalid storage element, an address of a valid storage element is aliased or a predetermined fixed value is provided to output as valid data;
outputting the test data from the random logic, wherein the outputted test data includes the valid data if the read to the invalid storage element is performed; and
comparing the outputted test data to an expected value to test the non-scannable memory array of the integrated circuit.

12. The method of claim 11, further comprising initializing the non-scannable memory array.

13. The method of claim 11, further comprising outputting the test data from the random logic to a multiple-input signature register (MISR).

14. The method of claim 11, further comprising initializing the memory array using data from the random logic.

15. The test method of claim 11, wherein responsive to a read address and write address being the same for a particular clock cycle, providing data presented for the write address as output from the same address, providing a fixed value as output from the same address, or inverting read or write address signals.

16. The test method of claim 11, wherein responsive to an existence of two or more write ports in the non-scannable memory array during the propagation of test data, prioritizing each write port relative to other write ports.

17. An integrated circuit, comprising:
random logic communicatively coupled to a non-scannable memory array; and
a logic built-in self-test (BIST) controller to apply test data to the random logic to test the random logic, wherein the test data is written to the non-scannable memory array and read from the non-scannable memory array, and in response to a read to an invalid storage element, an address of a valid storage element is aliased or a predetermined fixed value is provided in the test data read from the non-scannable memory,
wherein the test data read from the non-scannable memory array is compared to an expected value to detect whether a defect is present in the non-scannable memory array.

18. The integrated circuit of claim 17, wherein the logic BIST controller propagates the test data through the random logic causing the test data to be written to and read from the non-scannable memory array.

19. The integrated circuit of claim 17, wherein the logic BIST controller causes output of the test data from the random logic to a multiple-input signature register (MISR).

20. The integrated circuit of claim 17, wherein data from the random logic is used to initialize the non-scannable memory array.

* * * * *

UNITED STATES PATENT AND TRADEMARK OFFICE
CERTIFICATE OF CORRECTION

Page 1 of 1

PATENT NO.        : 8,621,304 B2
APPLICATION NO.   : 10/960590
DATED             : December 31, 2013
INVENTOR(S)       : Fred Hartnett et al.

It is certified that error appears in the above-identified patent and that said Letters Patent is hereby corrected as shown below:

In the Claims

Column 5, line 11, in Claim 4, delete "claims" and insert -- claim --, therefor.

Signed and Sealed this
Twenty-seventh Day of May, 2014

Michelle K. Lee
*Deputy Director of the United States Patent and Trademark Office*